US010127949B2

(12) United States Patent
Mayhall

(10) Patent No.: US 10,127,949 B2
(45) Date of Patent: Nov. 13, 2018

(54) HEAT AND FLOW MANAGEMENT IN A COMPUTING DEVICE

(71) Applicant: Evtron, Inc., Saint Louis, MO (US)

(72) Inventor: Andrew William Mayhall, Saint Louis, MO (US)

(*) Notice: Subject to any disclaimer, the term of this patent is extended or adjusted under 35 U.S.C. 154(b) by 0 days.

(21) Appl. No.: 15/514,215

(22) PCT Filed: Nov. 12, 2014

(86) PCT No.: PCT/US2014/065248
§ 371 (c)(1),
(2) Date: Mar. 24, 2017

(87) PCT Pub. No.: WO2016/048391
PCT Pub. Date: Mar. 31, 2016

(65) Prior Publication Data
US 2017/0301375 A1    Oct. 19, 2017

Related U.S. Application Data

(60) Provisional application No. 62/055,348, filed on Sep. 25, 2014.

(51) Int. Cl.
*H05K 7/20*       (2006.01)
*G11B 33/14*      (2006.01)
(Continued)

(52) U.S. Cl.
CPC ........ *G11B 33/1426* (2013.01); *G11B 33/027* (2013.01); *H05K 7/1487* (2013.01); *H05K 7/20409* (2013.01); *H05K 7/20709* (2013.01)

(58) Field of Classification Search
None
See application file for complete search history.

(56) References Cited

U.S. PATENT DOCUMENTS 4,656,559 A * 4/1987 Fathi ................. H05K 7/20409
                                                    361/721
5,299,944 A * 4/1994 Larabell ................ G06F 1/184
                                                    439/157
(Continued)

FOREIGN PATENT DOCUMENTS

EP         0564119 A2    10/1993
KR     20010090296 A    10/2001
(Continued)

OTHER PUBLICATIONS

International Search Report and Written Opinion, dated Feb. 24, 2015, for PCT/US2014/065248 (16 pgs).

(Continued)

*Primary Examiner* — Courtney Smith
(74) *Attorney, Agent, or Firm* — Armstrong Teasdale LLP

(57) ABSTRACT

A computing device caddy for housing a computing device is provided. The caddy includes a first caddy component. The first caddy component includes a first end wall including a first plurality of fins coupled to an outer surface of the first end wall. The first plurality of fins are configured relative to each other to create eddies within a flow. The caddy also includes a second caddy component. The second caddy component includes a second end wall. The second end wall is opposite the first end wall. The second caddy component is coupled to the first caddy component, thereby defining a cavity for housing the computing device.

15 Claims, 13 Drawing Sheets

(51) Int. Cl.
*G11B 33/02* (2006.01)
*H05K 7/14* (2006.01)

(56) References Cited

U.S. PATENT DOCUMENTS

| | | | |
|---|---|---|---|
| 5,311,931 A * | 5/1994 | Lee | C21D 1/56 |
| | | | 165/109.1 |
| 5,564,802 A | 10/1996 | Chiou | |
| 5,668,697 A * | 9/1997 | Dowdy | G11B 33/08 |
| | | | 361/679.34 |
| 6,144,556 A * | 11/2000 | Lanclos | H05K 7/20145 |
| | | | 361/695 |
| 6,201,700 B1 * | 3/2001 | Tzinares | H05K 7/20854 |
| | | | 165/185 |
| 6,373,696 B1 | 4/2002 | Bolognia et al. | |
| 8,009,431 B2 * | 8/2011 | Sun | G06F 1/181 |
| | | | 361/679.54 |
| 8,081,471 B2 * | 12/2011 | Abert | H05K 7/20136 |
| | | | 174/547 |
| 8,681,501 B2 * | 3/2014 | Govindasamy | G06F 1/203 |
| | | | 174/16.3 |
| 9,140,502 B2 * | 9/2015 | Kaslusky | F28F 13/06 |
| 9,743,553 B2 * | 8/2017 | Kim | H05K 7/20336 |
| 2002/0093759 A1 | 7/2002 | Okunaga et al. | |
| 2004/0174673 A1 | 9/2004 | Lin | |
| 2004/0184237 A1 | 9/2004 | Chang | |
| 2005/0091949 A1 | 5/2005 | Origlia | |
| 2006/0082973 A1 * | 4/2006 | Egbert | H05K 7/20154 |
| | | | 361/709 |
| 2009/0180251 A1 | 7/2009 | Biagini et al. | |
| 2016/0295719 A1 * | 10/2016 | Suzuki | H05K 5/0213 |

FOREIGN PATENT DOCUMENTS

| | | |
|---|---|---|
| KR | 20100009781 U | 10/2010 |
| WO | 2012158289 A1 | 11/2012 |

OTHER PUBLICATIONS

An Extended EP Search Report (EESR), dated May 17, 2018, for related EP patent application No. EP 14902488.4.

* cited by examiner

HEAT AND FLOW MANAGEMENT IN A COMPUTING DEVICE

CROSS-REFERENCE TO RELATED APPLICATION

This application claims the benefit of U.S. Provisional Patent Application No. 62/055,348 filed on Sep. 25, 2014, which is hereby incorporated by reference herein in its entirety.

BACKGROUND OF THE DISCLOSURE

The subject matter disclosed herein relates generally to heat sink and flow technology for computer servers and, more specifically, to enclosure systems and methods for cooling computing components in a computing system.

Computing systems, such as enterprise-class servers and storage arrays, generate a considerable amount of heat during operation. These computing systems often include many components, such as processors, memory modules, disk drives, power supplies, and other components, all of which may contribute to the overall heat output of the system. In a typical data center environment, multiple computing systems are mounted in racks and operated in close proximity to one another. As server density increases, so does the total amount of heat generated. This heat poses challenges in the form of risks to the operational health of the server, or to the power consumption and cooling of the data hosting facility. As computing systems heat up, the performance of the various individual components can be negatively impacted by high operating temperatures, potentially resulting in reductions in computing speed, or an increased error rates, or even a complete failure of the device. Consequently, data hosting facilities spend a significant amount of money on traditional cooling equipment and electricity.

To protect computing systems, some known datacenters circulate cool air into the datacenter environment and pull hot air away from the computing systems via a system of fans and vents. However, air cooling alone may be insufficient, limiting the computing densities of some computing systems and datacenters.

In light of this, server manufacturers have responded in different ways to these challenges. Some known data storage devices are now engineered to reduce the amount of electricity needed for operation, resulting in a reduction of heat generated. In other known systems, the number of data storage devices within a single enclosure (i.e., the "device density" of the enclosure) has been limited to alleviate heat concerns. While this reduces the heat generated within an enclosure, it also limits the storage capacity of the enclosure, and so increases the number of enclosures necessary: As a result, the size and expense requirements of the data hosting facilities likewise increase.

BRIEF DESCRIPTION OF THE DISCLOSURE

In one aspect, a computing device caddy for housing a computing device is provided. The caddy includes a first end wall. The caddy also includes a second end wall opposite of the first end wall. A cavity is defined between the first end wall and the second end wall for housing the computing device. The caddy further includes a plurality of fins coupled to an outer surface of at least one of the first end wall and the second end wall. The plurality of fins are configured relative to each other to create eddies within a flow.

In another aspect, a computing device caddy for housing a computing device is provided. The caddy includes a first caddy component. The first caddy component includes a first end wall including a first plurality of fins coupled to an outer surface of the first end wall. The first plurality of fins are configured relative to each other to create eddies within a flow. The caddy also includes a second caddy component. The second caddy component includes a second end wall. The second end wall is opposite the first end wall. The second caddy component is coupled to the first caddy component, thereby defining a cavity for housing the computing device.

BRIEF DESCRIPTION OF THE DRAWINGS

FIGS. 1-11 illustrate example embodiments of the methods and systems described herein, in which like characters represent like parts throughout the drawings.

FIG. 1 is a perspective view of an example individual component enclosure ("caddy").

FIG. 2 is a disassembled view of the caddy shown in FIG. 1.

FIG. 5 is a perspective view of the rear side of another example caddy.

FIG. 6 is a disassembled view of the caddy shown in FIG. 5.

FIG. 8 is a perspective view of an example enclosure assembly that may be used with one or more caddies such as the caddy shown in FIGS. 1-4 and the caddy shown in FIGS. 5-7.

FIG. 10 is a perspective view of an alternative cooling divider that may be used with the enclosure shown in FIG. 8.

FIG. 11 is a section view of the cooling divider shown in FIG. 10.

DETAILED DESCRIPTION OF THE DISCLOSURE

Figure 1:
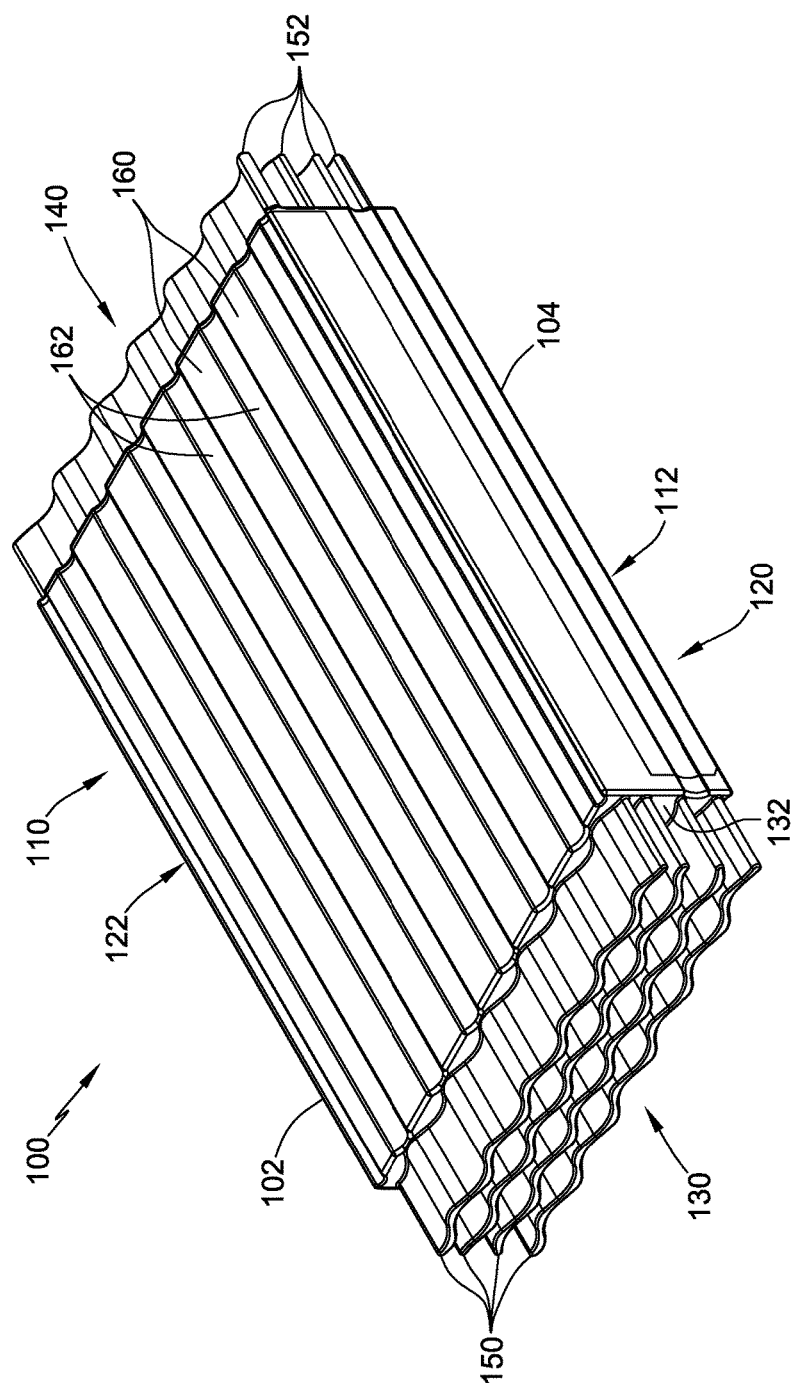

Embodiments of the present disclosure facilitate the cooling of computing components within a computer enclosure, such as a plurality of storage devices within storage chassis. In one example embodiment, an individual component enclosure ("caddy") is provided for a disk drive. The caddy is made from a heat-transferring material such as aluminum and is sized to be only slightly larger than the disk drive itself. During assembly, the disk drive is mounted into a caddy such that the disk drive is in contact with multiple surfaces of the caddy to enable heat to transfer directly from the disk drive into the material of the caddy. The caddy includes heat-conducting fins located at opposite ends of the caddy. During operation, heat transfers from the disk drive and the interior of the caddy through the aluminum caddy body and into the heat-conducting fins. The heat is then removed by passing an air or fluid flow over the surfaces of the fins, thereby transferring this heat into the flow and away from the drive.

In some embodiments, the caddy is sealed to air and/or liquid, allowing the caddy to be submerged in a liquid such as a dielectric fluid. The caddy also includes a pressure-equalization surface that allows the internal volume of the caddy to expand or contract slightly as the ambient air pressure of the caddy interior changes. Further, the caddy is configured with a data port and a power port, each of which is sealed to maintain the air and/or liquid integrity of the caddy interior while allowing operation of the disk drive within.

Further, in some embodiments, an enclosure is provided. The enclosure includes a plurality of caddies, with each having a computing component such as a disk drive within. The caddies are mounted to an underlying circuit board that includes both power and data coupling connectors. The caddies are mounted together such that a surface of one caddy touches a surface of another caddy across approximately the entire surface, thereby enabling heat to transfer between the caddies. In some embodiments, caddies are separated by a gap plate, which is also made from a heat-transferring material such as aluminum. The gap plate is hollow so that a fluid flow, either of air or of liquid, may be circulated through the gap plate interior. During operation, a measure of heat is transferred from the disk drives to the caddy bodies, from the caddy bodies to the material of the gap plate, and subsequently, from the material of the gap plate into the flow circulating through the gap plate. The heated flow then exits the enclosure, thereby, removing heat from the computing components, to cool the computing system.

As used herein, an element or step recited in the singular and proceeded with the word "a" or "an" should be understood as not excluding plural elements or steps unless such exclusion is explicitly recited. Furthermore, references to "one embodiment" of the present invention are not intended to be interpreted as excluding the existence of additional embodiments that also incorporate the recited features.

FIG. 1 is a perspective view of an example individual component enclosure ("caddy") 100. In the example embodiment, caddy 100 is a "two-piece caddy" illustrated in an assembled configuration, including a first piece ("base sleeve") 102 and a second part ("sliding sleeve") 104. When fully assembled, caddy 100 includes a typical rotational disk drive (not shown in FIG. 1) inside caddy 100 (i.e., in an interior volume not shown in FIG. 1). In other embodiments, caddy 100 may include other computing components such as one or more processors, memory modules, graphics processing units (GPUs), power supplies, other data storage devices such as solid state drives (SSDs), and or other computing components. As such, the dimensions of caddy 100 may vary to suit the enclosed computing component(s).

In the example embodiment, caddy 100 includes a front wall 110 and an opposing rear wall 112 (not visible in FIG. 1). Front wall 110 includes a plurality of plateau surfaces 160, as well as a plurality of "grooves" or "valleys" 162 that are disposed between plateaus 160 and that recede into or beneath the surface level of front wall 110 (e.g., below plateaus 160). Caddy 100 also defines a side wall 120 and an opposing side wall 122 (not visible in FIG. 1). Further, caddy 100 defines a top end 130 and a bottom end 140. Each of top end 130 and bottom end 140 include a plurality of top fins 150 and bottom fins 152. In the example embodiment, fins 150 and 152 are serpentine in shape. Top end 130 includes a top end wall 132 onto which the top end fins 150 are coupled to caddy 100.

Figure 2:
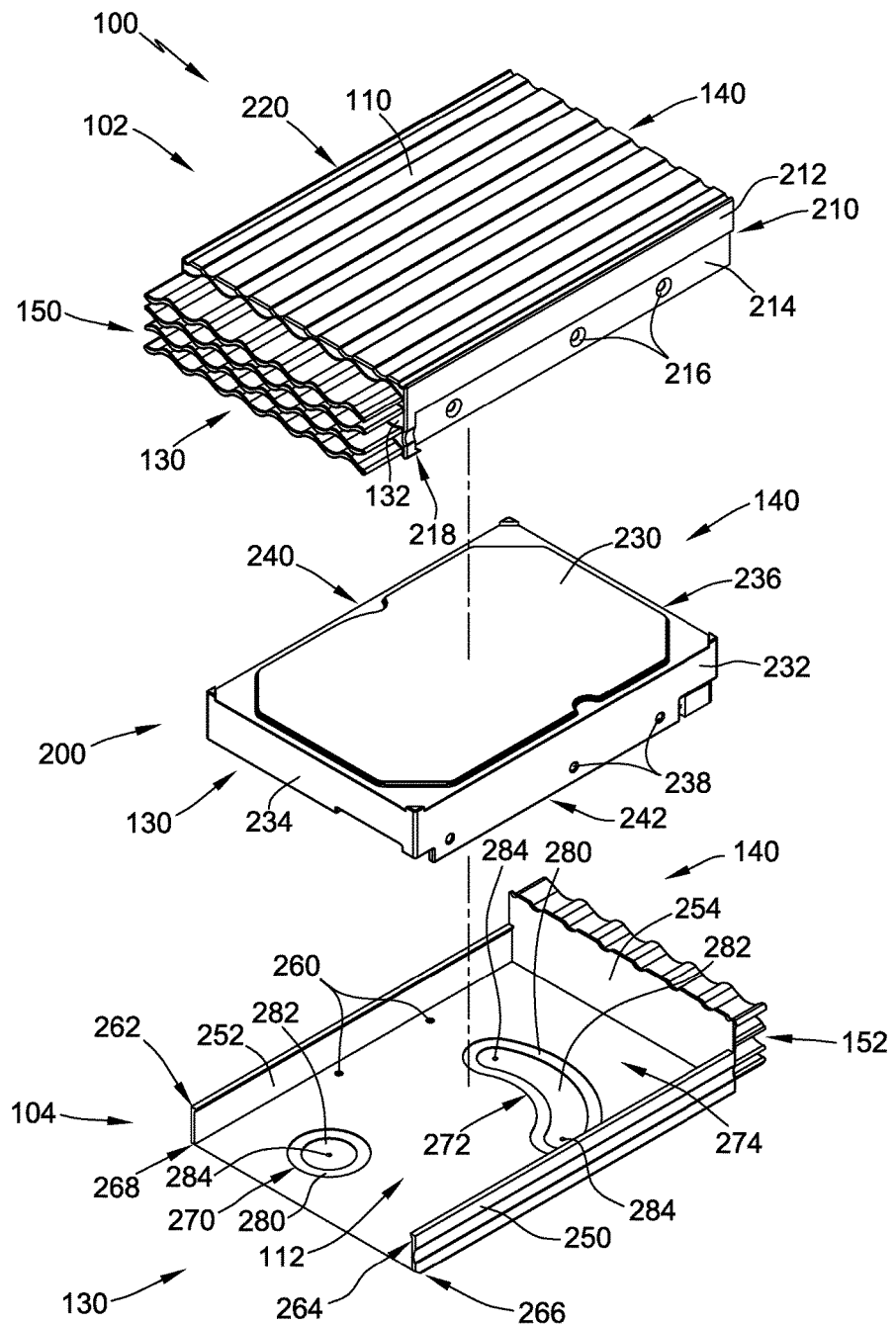

FIG. 2 is a disassembled view of caddy 100 (shown in FIG. 1). In the example embodiment, caddy 100 includes base sleeve 102, sliding sleeve 104, and a 3.5" form factor disk drive 200. In addition to the parts shown in FIG. 1, base sleeve 102 includes a side wall 210 having an exterior surface 212 and a slide rail surface 214. Slide rail surface 214 is slightly inset relative to exterior surface 212, and includes a plurality of beveled screw holes 216. At the top end of slide rail surface 214, side wall 210 includes a slide receptor chamfer 218 (not visible in FIG. 2). The bottom end 140 of base sleeve 102 is open (having no end surface such as that of top end wall 132 of top end 130). Further, base sleeve 102 also includes another side wall 220 (not visible on FIG. 2) disposed on base sleeve 102 opposite side wall 210. The opposing side wall 220 is symmetrically configured to side wall 210, having a slide rail surface symmetrical to slide rail surface 214 and an exterior surface symmetrical to exterior surface 212.

Disk drive 200, in the example embodiment, includes a front surface 230 and a rear surface 242 (not visible in FIG. 2), a top surface 234 opposite a bottom surface 236, and a side surface 232 opposite another side surface 240. Both side surfaces 232 and 240 include a plurality of mounting screw holes 238 common to various known form factors for disk drives. Bottom surface 236 may include one or more of power connectors (e.g., Molex 8981-style 4-pin connector, 15-pin Serial ATA (SATA) connector), data connectors (e.g., serial attached small computer system interface (SCSI) (SAS) connector, SATA data connector, fiber channel data connector), and/or configuration switches. Rear surface 242 also includes a plurality of mounting screw holes (not shown in FIG. 2).

Sliding sleeve 104, in the example embodiment, includes rear wall 112, side walls 250 and 252, and a bottom wall 254. Bottom wall 254 is coupled to a plurality of bottom fins 152. Bottom wall 254 also includes one or more ports (not shown in FIG. 2) for data and/or power connectors.

In the example embodiment, side walls 252 and 250 include chamfer rails 262 and 264, respectively, running the length of their front edges. Chamfer rails 262 and 264 extend slightly toward an interior 274 of sliding sleeve 104. Further, side walls 250 and 252 also include chamfer notches 266 and 268 at top end 130 of side walls 250 and 252 proximate the intersection side walls 250, 252 and rear wall 112.

Additionally, in the example embodiment, rear wall 112 includes a plurality of mounting screw holes 260. Rear wall 112 also includes a first expansion port 270 and a second expansion port 272. In the example embodiment, rear wall 112 is sheet aluminum that includes two thermal expansion ports 270 and 272. Each expansion port 270 and 272 includes a mounting surface 280 that is set below the plane of the inner surface of rear wall 112. Further, each expansion port 270 and 272 also includes an expansion border surface 282 that is set below the plane of the mounting surface 280. In the example embodiment, mounting surfaces 280 are $\frac{1}{64}^{th}$ of an inch below the inner surface of rear wall 112, and expansion border surfaces 282 are 1/64th of an inch below the mounting surfaces 280.

In the example embodiment, an expansion layer (not shown) is coupled within expansion ports 270 and 272. The expansion layer is approximately the shape of the outer edge of mounting surface 280 and approximately 1/64 of an inch thick. The expansion layer is inserted and adhesively coupled to mounting surface 280. In some embodiments, the expansion layer is a flexible multi-layered Gore-tex® sheet that resists liquid penetration but allows at least some gas penetration (e.g., gas permeable but not liquid permeable). In other embodiments, the expansion layer is a flexible rubber membrane that resists both liquid and gas penetration. When assembled, an expansion volume is defined between the outer surface of the expansion layer and the expansion border surface 282 (e.g., 1/64th of an inch separating the two surfaces), and bordered by the inner edge of mounting surface 280.

During operation, in some embodiments, as disk drive 200 heats up due to use, the ambient air within caddy 100 heats up as well. To help maintain a consistent internal air pressure, the flexible rubber membrane flexes outward toward the expansion border surface 282 as the air temperature and internal pressure within caddy 100 rises. As the expansion layer flexes into the expansion volume, the contents of that expansion volume (e.g., whatever air or liquid is used to cool caddy 100) may vacate the expansion volume through relief eyelets 284 (e.g., a relief aperture through rear wall 112 of caddy 100). Similarly, as internal temperature and pressure fall, the expansion layer recedes from the expansion volume, and the expansion volume may be refilled with the external air or liquid.

During assembly of caddy 100, in the example embodiment, disk drive 200 is inserted into an interior space (not shown in FIG. 2) of base sleeve 102 such that mounting screw holes 238 approximately align with the plurality of beveled screw holes 216. Disk drive 200 is removably coupled to base sleeve 102 using a plurality of beveled-head screws (not shown) inserted or screwed through beveled screw holes 216 and into mounting screw holes 238. In the example embodiment, mounting screw holes 238 are threaded to accept the screws, and beveled screw holes are not threaded. In some embodiments, a sealant may be applied to the beveled screws such that a seal is formed when the beveled screw head seats into beveled screw holes 216. Further, when fully seated, the screw heads sit approximately at or below the level of slide rail surface 214 such as not to impede sliding along slide rail surface 214.

With disk drive 200 coupled to base sleeve 102, sliding sleeve 104 is then slid onto or over base sleeve 102. More specifically, in the example embodiment, the top end 130 of sliding sleeve 104 slides onto the bottom end 140 of base sleeve 102 such that side walls 250 and 252 cover and/or mate with slide surfaces 214 of side walls 210 and 220. In some embodiments, slide surfaces 214 define a groove along the front edge of sliding surfaces 214 (i.e., near the border between sliding surface 214 and external surface 212) such as to accommodate chamfers 262 and 264. Sliding sleeve 104 slides along sliding surface 214 until the top end of side walls 250 and 252 (e.g., chamfers 266 and 268) make contact and seat with the top end 130 of base sleeve 102 (e.g., chamfer 218).

When sliding sleeve 104 is finally positioned, bottom wall 254 aligns with bottom edges of side walls 210 and 220 and front wall 110. Additionally, mounting drive holes 260 approximately align with threaded mounting drive holes on rear surface 242 of the disk drive. A plurality of screws (not shown) are screwed from the rear side of caddy 100 (e.g., rear side of sliding sleeve 104) through mounting drive holes 260 and into the threaded mounting drive holes on rear surface 242. As such, sliding sleeve 104 is removably coupled to disk drive 200, thus forming caddy 100 (as shown in FIG. 1).

In the example embodiment, base sleeve 102 is sized to the dimensions of disk drive 200 such that the surfaces of disk drive 200 contact the adjacent surfaces of base sleeve 102 to facilitate heat transfer between disk drive 200 and caddy 100. In other words, after coupling disk drive 200 to base sleeve 102, one or more of the following surfaces are disposed touching each other along approximately all of their surfaces: front surface 230 is disposed touching an interior surface of front wall 110, top surface 234 is disposed touching an interior surface of top end wall 132, side surface 232 is disposed touching an interior surface of side wall 210, and/or side surface 240 is disposed touching an interior surface of side wall 220. In some embodiments, a thermal compound (not shown) may be applied to one or more of these surfaces prior to assembly to assist in the transfer of heat from disk drive 200 to base sleeve 102. It should be understood that, while FIG. 2 illustrates a typical half-height 3.5" disk drive, other size drives are possible. The various internal dimensions of caddy 100 (e.g., base sleeve 102 and sliding sleeve 104) may be sized to match. Further, the number and placement of holes 216 and 260 may vary based on the type and size of drive used.

In the example embodiment, when fully assembled, an interior space of caddy 100 is defined by the interior surfaces of base sleeve 102 and sliding sleeve 104. Disk drive 200 occupies a portion of this interior space. In some embodiments, this interior space is approximately liquid- and/or air-sealed to the outside. In other words, a negligible amount of external liquid and/or air can get into our out of the internal space during normal operating conditions. As such, in some embodiments, caddy 100 may be submersed in a liquid such as a dielectric fluid, and the internal components of caddy 100 (e.g., disk drive 200) are substantially protected from the liquid. The interior space, thus, defines an enclosed space defining a particular air pressure (e.g., 1.00 atmospheres). As caddy 100 heats up and cools down during operation, the air within the interior space also heats up and cools down. It is well known in the art that hotter air causes greater air pressure within an enclosed space. It is also known that some computing units, such as certain rotational disk drives, may be negatively impacted by changes in the ambient air pressure in which they operate. Thus, expansion ports 270 and 272 may flex outward or inward as the air within the interior space changes temperature, thereby reducing the change in the air pressure within the interior space.

Figure 3A:
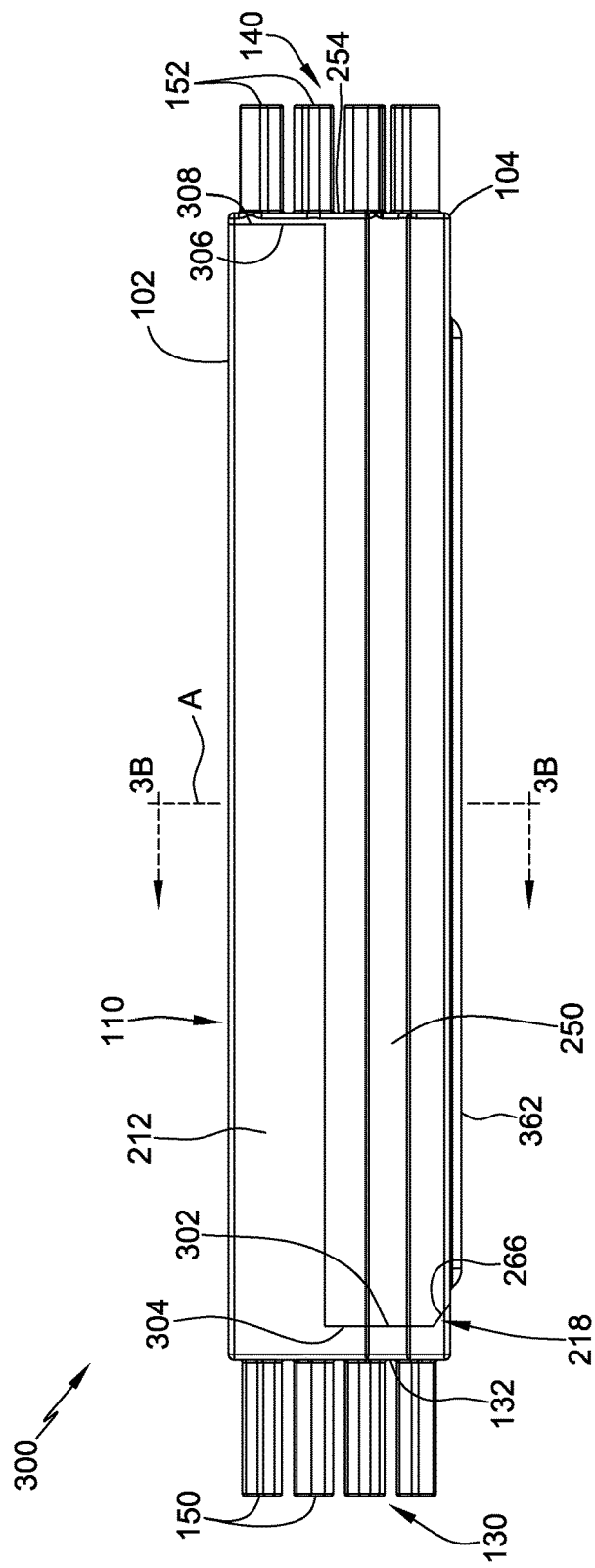
FIG. 3A is a side view of the assembled caddy shown in FIG. 1 without the internal component (e.g., without a disk drive), for sake of clarity.
Figure 3B:
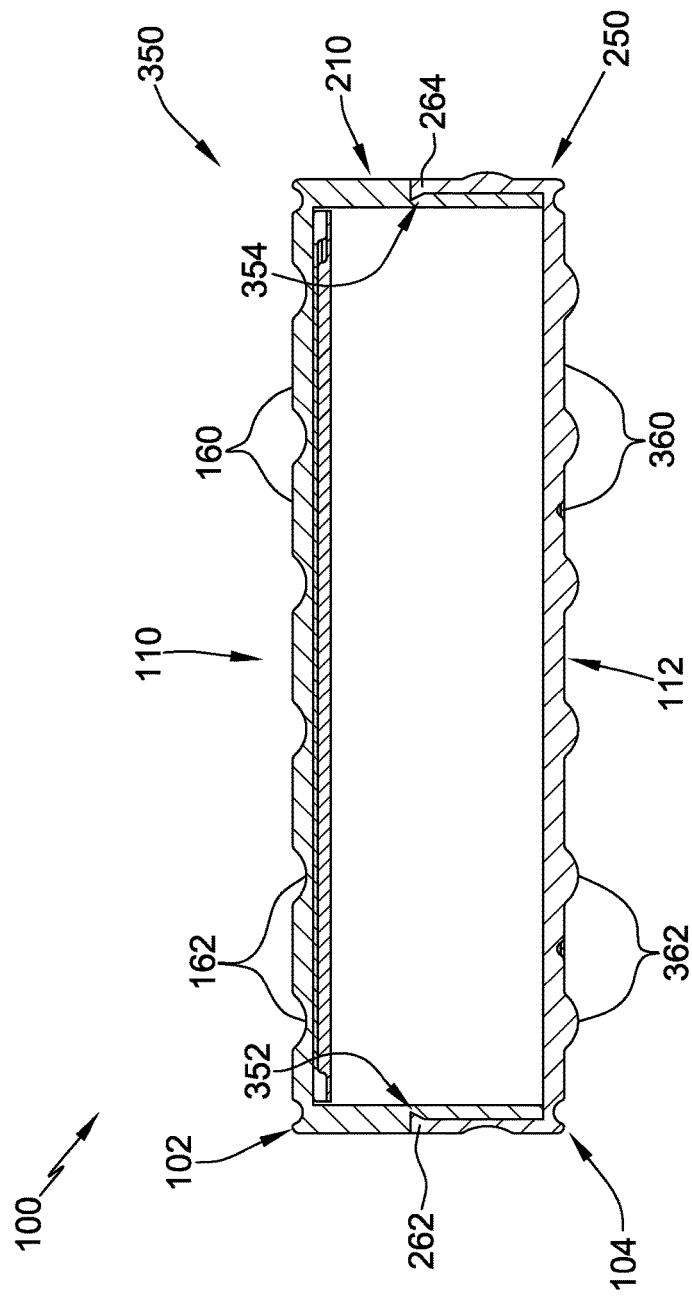
FIG. 3B shows a cross-sectional view of the same caddy taken across plane A of FIG. 3A.

FIG. 3A is a side view 300 of an assembled caddy 100 without the internal component (e.g., without disk drive 200), for sake of clarity. FIG. 3B shows a cross-sectional view of the same caddy 100 taken across plane A of FIG. 3A. During assembly, as described above, sliding sleeve 104 slides from the bottom end 140 of base sleeve 102 until it reaches the top end 130 of base sleeve 102. More specifically, in the example embodiment, base sleeve 102 includes chamfer slots 352 and 354 extending from a top end sliding stop surface 304 to the bottom end at approximately surface 306. Chamfers 262 and 264 slide into and down a length of the groove defined by chamfer slots 352 and 354, respectively, until a top end surface 302 of sliding sleeve 104 contacts top end sliding stop surface 304 and a back wall surface 308 reaches surface 306. When completely assembled, chamfer 266 seats with slide receptor chamfer 218 (and similarly on the opposite side with chamfer 268 and a similar slide receptor chamfer not shown).

In the example embodiment, sliding sleeve 104 includes a plurality of plateaus 360 and a plurality of ridges 362. Plateaus 360 are similar in dimension to plateaus 160, and ridges 362 are similar in shape to valleys 162 but inverted such that the positive shape presented by a ridge is the inverse of the negative shape presented by a valley. In other words, if a ridge were placed next to a valley, the ridge would occupy approximately all of the space defined by the valley such that approximately the entire surface of the valley is in contact with approximately the entire surface of the ridge. In addition, each valley on base sleeve 102 is aligned approximately with a corresponding ridge on sliding sleeve 104. For example, if a second, similar caddy (not shown in FIGS. 3A and 3B) were aligned adjacent to caddy 100 (e.g., touching an exterior surface of rear wall 112 of caddy 100), the valleys 162 and plateaus 160 of the second caddy would match the ridges 362 and plateaus 360 of caddy 100.

Figure 4A:
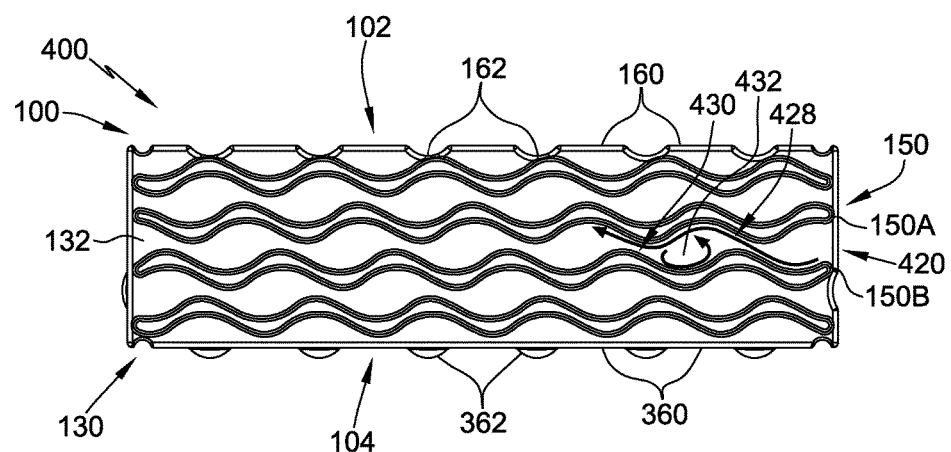
FIG. 4A is a top down view of the caddy shown in FIG. 1, including a plurality of fins.

FIG. 4A is a top down view 400 of caddy 100, including a plurality of fins 150. Each pair of adjacent fins 150, such as fins $150_A$ and $150_B$, defines a flow path 420. During operation, an air flow or a fluid flow is forced down flow paths 420 (e.g., from right to left in FIG. 4A). The flow is forced through a channel 428 and into a chamber 432 (e.g., between neighboring sides of fins $150_A$ and $150_B$). As the flow enters chamber 432, a majority of the flow passes along fin $150_A$ (on an approximately upper-left trajectory) and is then redirected by a wall of fin $150_A$ (on an approximately lower-left trajectory). This redirected flow encounters a wall of fin $150_B$ and is again redirected. Here, a portion of the flow is directed through channel 430 and into the next chamber (in similar fashion). Another portion of flow is redirected back into chamber 432 and passes along a surface of fin $150_B$ until it re-enters or re-joins the flow coming through channel 428. As such, an eddy or vortex is created in chamber 432 in which a portion of flow passes over not only the chamber surface of fin $150_A$, but also the chamber surface of fin $150_B$. Such eddies enable additional heat to be transferred from the walls of fins 150 and into the flow.

In the example embodiment, fins 150 are of a similar shape but not identical. The various humps or waves of fins 150 are staggered relative to each other such as to define the entry and exit channels (e.g., channels 428 and 430) that create the flow entry and exit trajectories that facilitate creating eddies. Since each fin begins and ends at the same edges (e.g., the right-most and left-most edges of caddy 100) but are staggered, the shapes are similar in their middle portions, but differ slightly at either end.

Figure 4B:
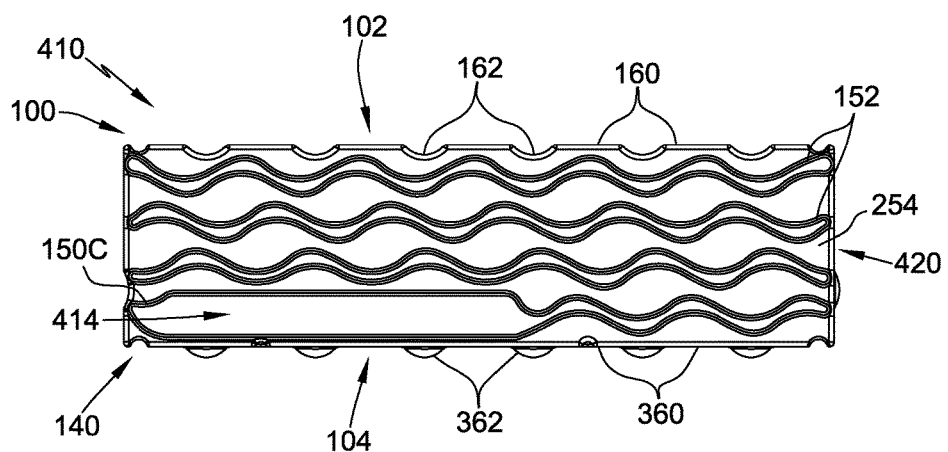
FIG. 4B is a bottom up view of the caddy shown in FIG. 4A, including a plurality of fins, one of which is a connector fin.

FIG. 4B is a bottom up view 410 of caddy 100, including a plurality of fins 150, one of which is a connector fin $150_C$. In some embodiments, caddy 100 includes one or more data and/or power ports (not shown) through, for example, bottom wall 254 of sliding sleeve 104. In the example embodiment, fin $150_C$ includes an interior port section 414 that is not directly a part of flow 420. In some embodiments, port section 414 includes a through-wall hole into which a data and/or power cable may be passed to connect the computing device(s) inside of caddy 100 (e.g., disk drive 200 (shown in FIG. 2)) to other computing components such as a circuit board, a motherboard, or power supply.

Figure 5:
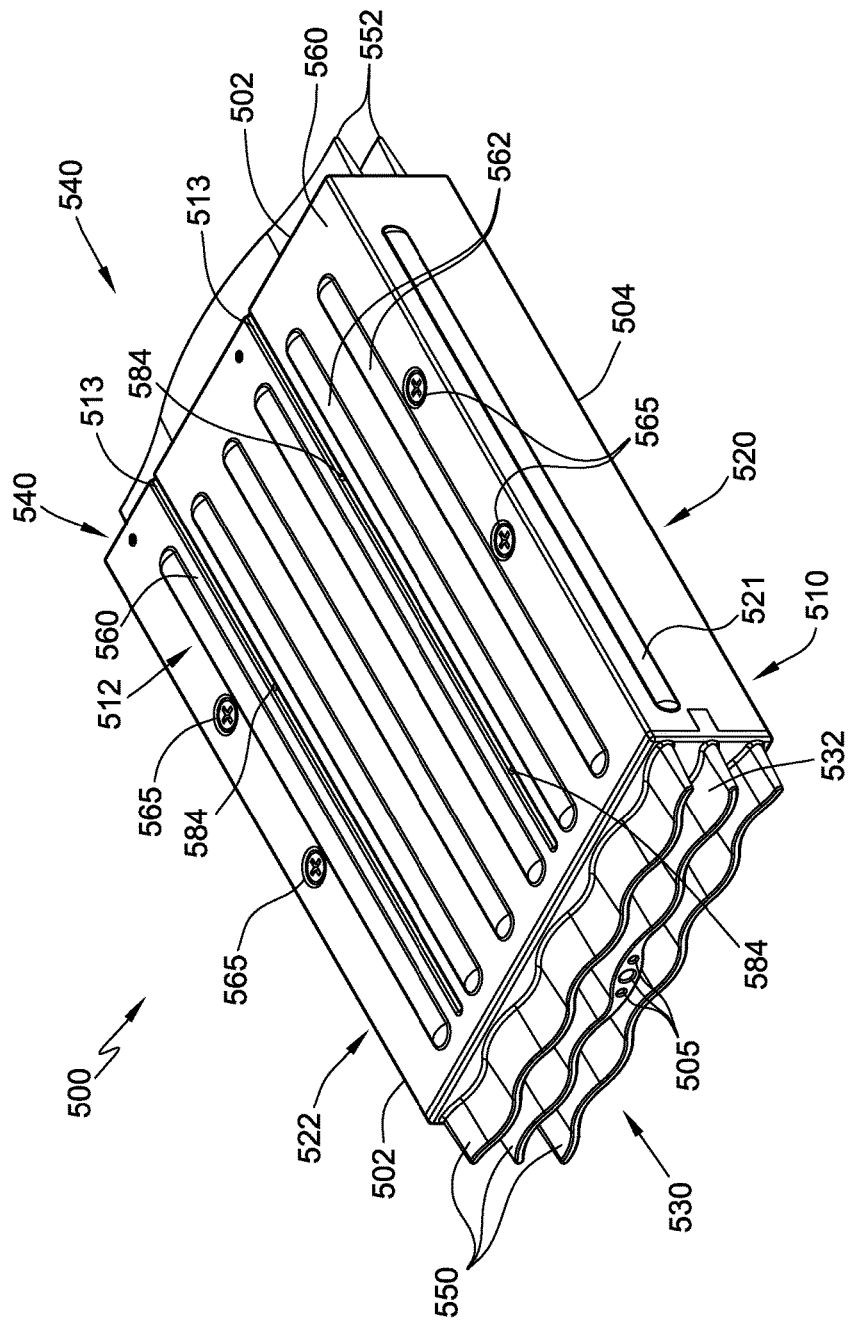

FIG. 5 is an perspective view of the rear side of another example caddy 500. In the example embodiment, caddy 500 is a "two-piece caddy" illustrated in an assembled configuration, including a first piece ("base sleeve") 502 and a second part ("sliding sleeve") 504. When fully assembled, caddy 500 includes a typical rotational disk drive as described above. In other embodiments, caddy 500 may include other computing components such as one or more processors, memory modules, graphics processing units (GPUs), power supplies, other data storage devices such as solid state drives (SSDs), or other computing components. As such, the dimensions of caddy 500 may vary to suit the enclosed computing component(s).

In the example embodiment, caddy 500 includes many features similar to caddy 100 (shown in FIGS. 1-4). In some embodiments, features of caddy 500 may be used with features of caddy 100. In the example embodiment, a rear wall 512 includes a plurality of mounting screw holes 565. Rear wall 512 includes a plurality of plateau surfaces 560, as well as a plurality of "ridges" 562 that are disposed between plateaus 560 and that rise above the surface level of rear wall 512 (e.g., above plateaus 560). Caddy 500 also defines a side wall 520 and an opposing side wall 522 (not visible in FIG. 5). Side wall 520 includes a ridge 521 similar to ridges 562. Further, caddy 500 defines a top end 530 and a bottom end 540. Top end 530 includes a plurality of top fins 550, and bottom end 540 includes a plurality of bottom fins 552. Top end 530 includes a top end wall 532 onto which the top end fins 550 are coupled to caddy 500. Rear wall 512 also includes two surface grooves 513 that extend from bottom end 540 of caddy 500 within a plateau 560 of rear wall 512. Within each surface groove 513 are one or more relief eyelets 584. These relief eyelets 584 are similar to relief eyelets 284, described above in reference to FIG. 2. Further, aspects of rear wall 512 such as, for example, surface grooves 513, may be applied to rear wall 112 (shown in FIG. 2).

Also in the example embodiment, top end 530 of caddy 500 includes one or more lights 505. These lights are electrically connected to the disk drive or other computing components within caddy 500. In the example embodiment, lights 505 are used to indicate drive activity, drive power, and error. Lights 505 are supported by an LED panel (not shown in FIG. 5) within caddy 500 and a ribbon cable communicatively coupling the drive to the LED panel.

Figure 6:
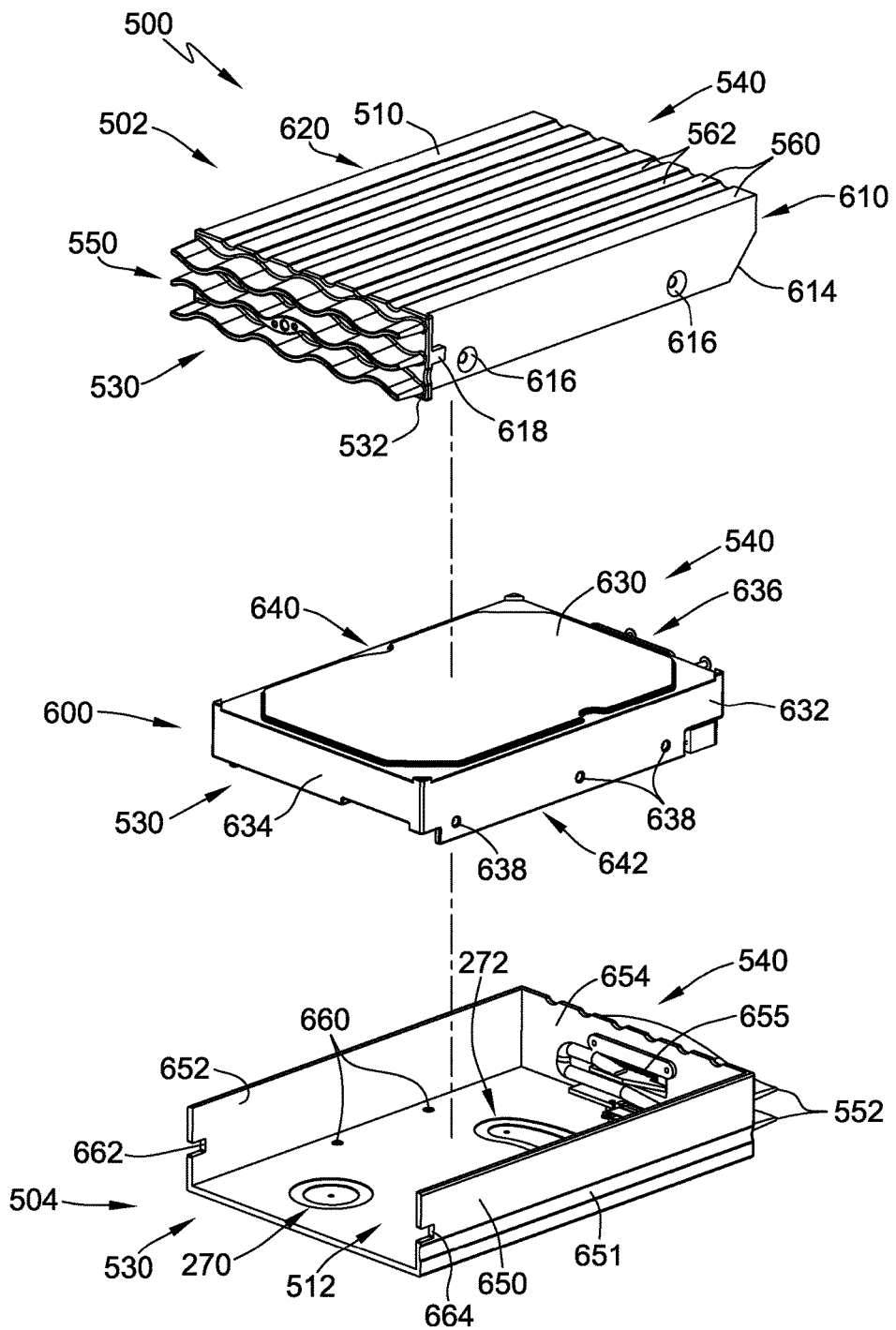

FIG. 6 is a disassembled view of caddy 500 (shown in FIG. 5). In the example embodiment, caddy 500 includes base sleeve 502, sliding sleeve 504, and a 3.5" form factor disk drive 600. In addition to the parts shown in FIG. 5, base sleeve 502 includes a side wall 610 that includes a plurality of beveled screw holes 616. Side wall 610 also includes an angled corner 614 near bottom end 540. At the top end of side wall 610, side wall 610 includes a slide nubbin 618. The bottom end 540 of base sleeve 502 is open (e.g., has no end wall opposite top end wall 532 of top end 530). Base sleeve 502 also includes another side wall 620 (not visible on FIG. 6) disposed on base sleeve 502 opposite side wall 610. The other side wall 620 is similarly configured to side wall 610, having a nubbin similar to nubbin 618. Front wall 510 of base sleeve 502 includes a plurality of plateaus 560 and a plurality of "grooves" or "valleys" 561 similar to plateaus 160 and valleys 162 (shown in FIG. 1).

Disk drive 600, in the example embodiment, includes a front surface 630 and a rear surface 642 (not visible in FIG. 6), a top surface 634 opposite a bottom surface 636, and a side surface 632 opposite another side surface 640. Both side surfaces 632 and 640 include a plurality of mounting screw holes 638 common to various known form factors for disk drives. Bottom surface 636 may include one or more of power connectors (e.g., Molex 8981-style 4-pin connector, 15-pin Serial ATA (SATA) connector), data connectors (e.g., serial attached small computer system interface (SCSI) (SAS) connector, SATA data connector, fiber channel data connector), and/or configuration switches. Rear surface 642 also includes a plurality of mounting screw holes (not shown in FIG. 6).

Sliding sleeve 504, in the example embodiment, includes rear wall 512, side walls 650 and 652, and a bottom wall 654. Bottom wall 654 is coupled to a plurality of bottom fins 552. Bottom wall 654 also defines a connector port 655 for data and/or power connectors. Side walls 652 and 650 include notches 662 and 664, respectively. Side wall 650 includes a valley 651 similar to valleys 561, and side wall 652 includes ridge 521 (shown in FIG. 5). Additionally, in the example embodiment, rear wall 512 also includes a first expansion port 270 and a second expansion port 272 similar to those described above in reference to FIG. 2.

During assembly of caddy 500, in the example embodiment, disk drive 600 is inserted into an interior space (not shown in FIG. 6) of base sleeve 502 such that mounting screw holes 638 approximately align with the plurality of beveled screw holes 616. Disk drive 600 is coupled to base sleeve 502 using a plurality of beveled-head screws (not shown) inserted or screwed through beveled screw holes 616 and into mounting screw holes 638. In the example embodiment, mounting screw holes 638 are threaded to accept the screws, and beveled screw holes are not threaded. In some embodiments, a sealant may be applied to the beveled screws such that a seal is formed when the beveled screw head seats into beveled screw holes 616. Further, when fully seated, the screw heads sit approximately at or below the outer surface level of side wall 610 such as not to impede sliding of sliding sleeve 504 during assembly.

With disk drive 600 coupled to base sleeve 502, sliding sleeve 504 is then slid onto or over base sleeve 502. More specifically, in the example embodiment, the top end 530 of sliding sleeve 504 slides onto the bottom end 540 of base sleeve 502 such that notch 664 mates with nubbin 618.

When sliding sleeve 504 is finally positioned, bottom wall 654 aligns with bottom edges of side walls 610 and 620 and front wall 510. Additionally, mounting drive holes 660 approximately align with threaded mounting drive holes on rear surface 642 of the disk drive. A plurality of screws (not shown) are screwed from the rear side of caddy 500 (e.g., rear side of sliding sleeve 504) through mounting drive holes 660 and into the threaded mounting drive holes on rear surface 642. As such, sliding sleeve 504 is removably coupled to disk drive 600, thus forming caddy 500 (as shown in FIG. 5). Further, in the example embodiment, caddy 500 is substantially sealed when sliding sleeve 504 is coupled to base sleeve 502. As such, the interior of caddy 500 and the computing device within (e.g., disk drive 600) may be sealed from, for example, an ambient liquid and/or air flowing around caddy 500 (e.g., through flow channels defined by fins 550, 552).

In the example embodiment, base sleeve 502 is sized to the dimensions of disk drive 600 such that the surfaces of disk drive 600 contact the adjacent surfaces of base sleeve 502 to facilitate contact and heat transfer between disk drive 600 and caddy 500. In other words, in some embodiments, after coupling disk drive 600 to base sleeve 502, one or more of the following surfaces are disposed touching each other along approximately all of their surfaces: front surface 630 is disposed touching an interior surface of front wall 510, top surface 634 is disposed touching an interior surface of top end wall 532, side surface 632 is disposed touching an interior surface of side wall 610, and/or side surface 640 is disposed touching an interior surface of side wall 620. In some embodiments, a thermal compound (not shown) may be applied to one or more of these surfaces prior to assembly to assist in the transfer of heat from disk drive 600 to base sleeve 502 and/or sliding sleeve 504. It should be understood that, while FIG. 2 illustrates a typical 3.5″ disk drive (e.g., a rotating disk drive, or a solid state drive (SSD)), other size drives are possible. The various internal dimensions of caddy 500 (e.g., base sleeve 502 and sliding sleeve 504) may be sized to match. For example, the distance between internal surfaces of front wall 510 and rear wall 512 may be approximately the height defined by disk drive 600 (e.g., along the vertical line shown in FIG. 6), and/or the distance between internal surfaces of side walls 610 and 620 may be approximately the width defined by disk drive 600. Further, the number and placement of holes 616 and 660 may vary based on the type and size of drive used.

Figure 7A:
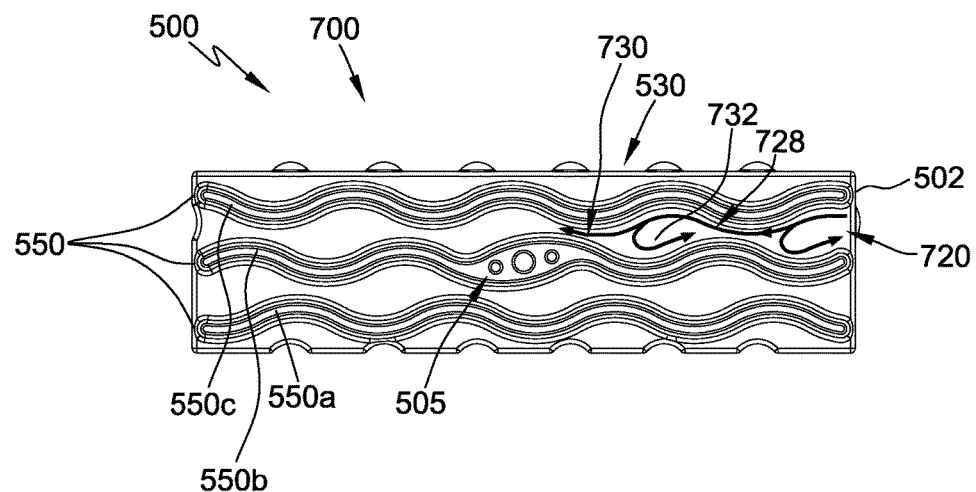
FIG. 7A is a top-down view of the top end of the caddy shown in FIG. 5, including a plurality of fins and a set of LED (Light Emitting Diodes) lights.

FIG. 7A is a top down view 700 of top end 530 of caddy 500, including a plurality of fins 550 and a set of LED lights 505. Each pair of adjacent fins 550, such as fins 550$_B$ and 550$_C$, defines a flow path 720. During operation, an air flow or a fluid flow is forced down flow paths 720 (e.g., from right to left in FIG. 7A). The flow is forced through a channel 728 and into a chamber 732 (e.g., between neighboring sides of fins 550$_B$ and 550$_C$). As the flow enters chamber 732, a majority of the flow passes along fin 550$_C$ (on an approximately upper-left trajectory) and is then redirected by a wall of fin 550$_C$ (on an approximately lower-left trajectory). This redirected flow encounters a wall of fin 550$_B$ and is again redirected. Here, a portion of flow is directed through channel 730 and into the next chamber (in similar fashion). Another portion of flow is redirected back into chamber 432 and passes along a surface of fin 550$_B$ until it re-enters or re-joins the flow coming through channel 728. As such, an eddy or vortex is created in chamber 732 in which a portion of flow passes over not only the chamber surface of fin 550$_A$, but also the chamber surface of fin 550$_B$. Such eddies enable additional heat to be transferred from the walls of fins 550 and into the flow.

In the example embodiment, fins 550 are of a similar shape but not identical. The various humps or waves of fins 550 are staggered relative to each other such as to define the entry and exit channels (e.g., channels 728 and 730) that create the flow entry and exit trajectories that facilitate creating eddies. Since each fin begins and ends at the same edges (e.g., the right-most and left-most edges of caddy 500) but are staggered, the shapes are similar in their middle portions, but differ slightly at either end. Further, in the example embodiment, one of the fins (e.g., fin 550$_B$) houses LED lights 505, and thus has a slightly different shape at its center.

Figure 7B:
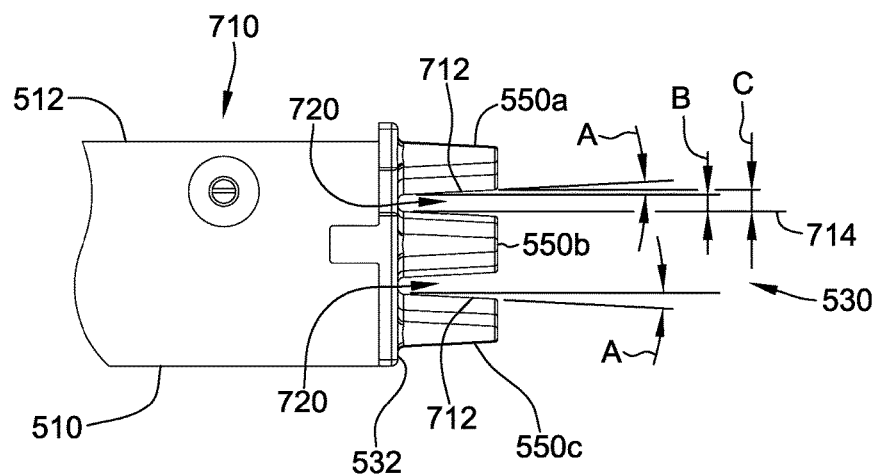
FIG. 7B is a side view of the top end of the caddy shown in FIG. 7A.

FIG. 7B is a side view 710 of top end 530 of caddy 500. In the example embodiment, outer fins 550$_A$ and 550$_C$ have inner surfaces 712 that are angled at an angle A relative to an axis 714, which is parallel to front wall 510 and/or rear wall 512. In some embodiments, angle A is approximately 3 degrees. As such, generally speaking, the gap between neighboring fins (e.g., fins 550$_A$ and 550$_B$) is narrower nearer wall 532 and wider farther away from wall 532. In other embodiments, fins 550 may be approximately parallel to each other (e.g., angle A of approximately 0 degrees).

Figure 7C:
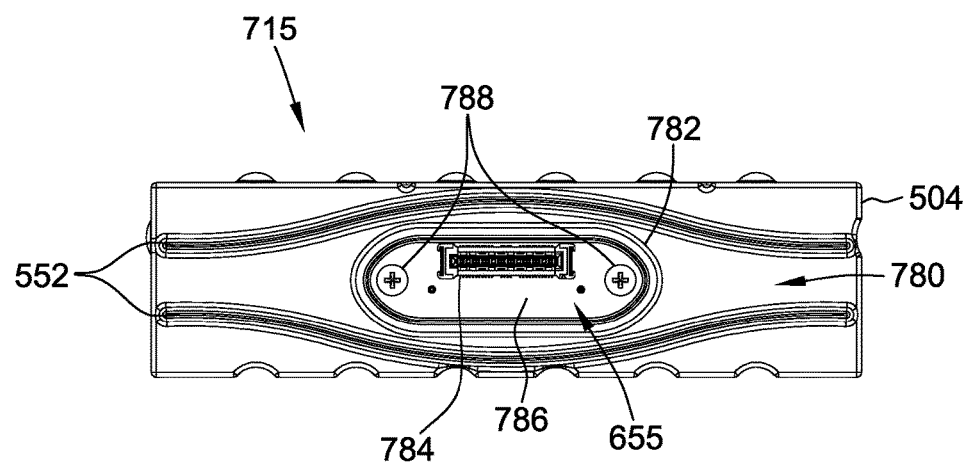
FIG. 7C is a bottom up view of the caddy shown in FIG. 5, including a plurality of fins, a connector port, and a connector border fin.

FIG. 7C is a bottom up view 715 of caddy 500, including a plurality of fins 552, a connector port 655, and a connector border fin 782. In the example embodiment, connector port 655 presents an opening through bottom wall 654 of sliding sleeve 504. Connector port 655 includes a connector 784 mounted in a connector surface 786. The connector surface 786 includes mounting holes 788 for securing connector port 655 to interior components. In the example embodiment, connector 784 is a male connector of the FT5 series offered by Samtec of New Albany, Ind. In some embodiments, fins 552 and/or border fin 782 may be angled similar to fins 550 shown and described in relation to FIG. 4B. In the example embodiment, connector 784 includes both data and power paths for enabling data to flow into and out of drive 600 and for powering drive 600. Further, caddy 500 includes connector parts (not shown) to communicatively couple data and power paths from connector 784 to appropriate data and power ports on drive 600.

It should be understood that various features and combinations of features described with respect to caddy 100 (shown in FIGS. 1-4) and caddy 500 (shown in FIGS. 5-7) may be used interchangeably, and are still within the scope of this disclosure.

Figure 8:
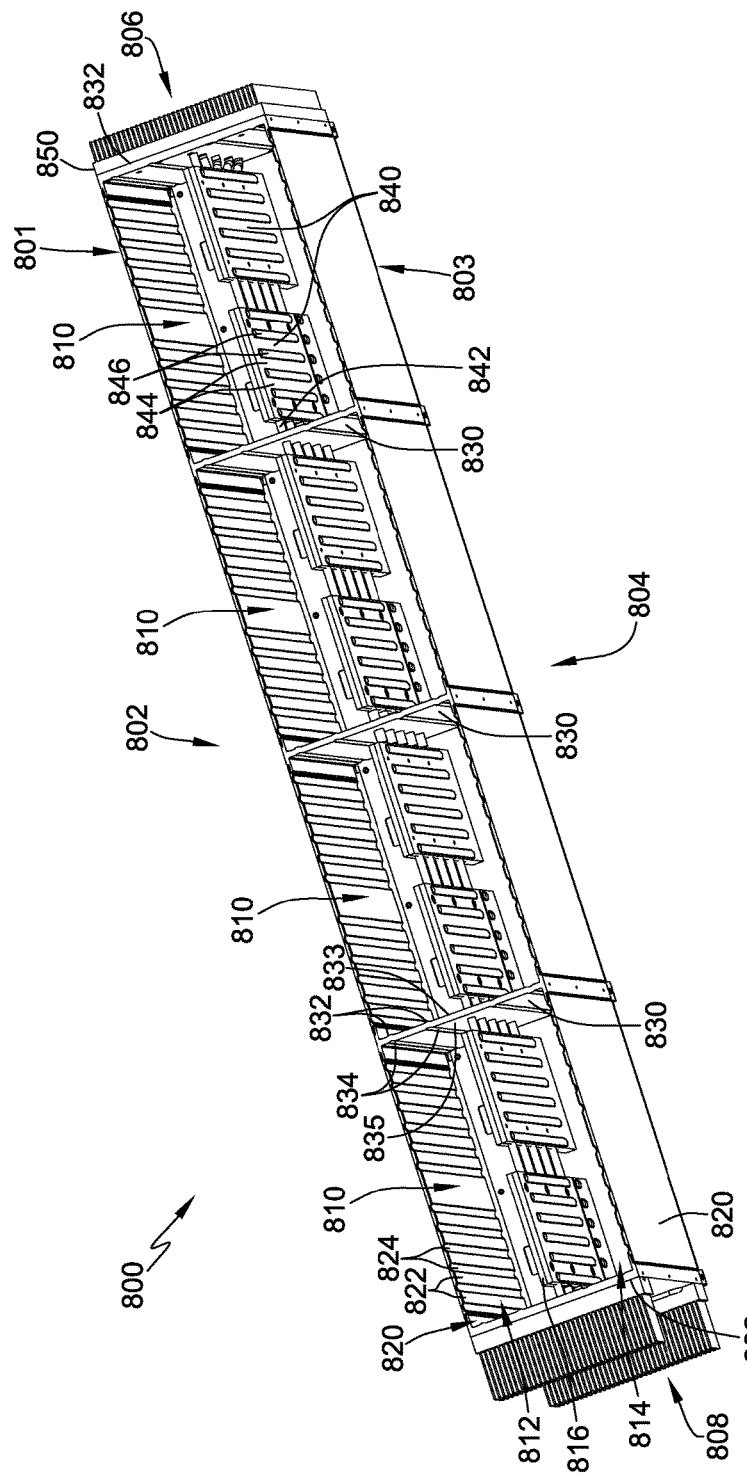

FIG. 8 is a perspective view of an example enclosure assembly 800 that may be used with one or more caddies such as caddy 100 (shown in FIGS. 1-4) and caddy 500 (shown in FIGS. 5-7). In the example embodiment, enclosure 800 includes four sub-assemblies 810. Each sub-assembly 810 is divided into two 4-caddy areas 812 and 814 separated by a cooling divider 816. Assembly 800 is bordered by and includes a circuit board (not shown in FIG. 8) on a bottom side 803. Each sub-assembly 810 is sized to fit two sets or "blocks" of four caddies (e.g., caddy 500), where each block of caddies is oriented in a two-by-two arrangement.

In the example embodiment, sub-assemblies 810 are bordered on a left side 802 and a right side 804 by side panels 820. Each side panel 820 includes a plurality of plateaus 822 and valleys 824 sized and separated to match the plateaus and ridges of caddies (e.g., plateaus 560 and ridges 562 of caddy 500, shown and described in reference to FIG. 5) when the caddies are installed.

Sub-assemblies 810, in the example embodiment, are also bordered by one or more rib plates 830 and/or end plates 832. Rib plates 830 include two ridges 832 on a first surface 833 of plate 830 and two valleys 834 on a second surface 835 of plate 830, and similarly a second pair of ridges and valleys oppositely oriented on the opposite end of rib plate 830. Ridges 832 and valleys 834 are sized and shaped to match and mate with valleys 651 and ridges 521 on the side walls 520 and 522 of caddies 500 when installed. Further, the two ridges 832 are separated from each other by a distance of approximately the width of a caddy (e.g., the width of caddy 500) such as to enable two caddies to be installed adjacent to each other (e.g., touching surfaces).

In the example embodiment, cooling divider 816 spans across all four sub-assemblies 810. Cooling divider 816 includes eight cooling plates 840. Each cooling plate 840 includes a plurality of plateaus 844 and ridges 846 sized and spaced to match and mate with plateaus and valleys of caddies (e.g., plateaus 560 and valleys 561 of caddy 500, shown and described in reference to FIG. 6). Cooling divider 816 also includes copper piping 842 that passes through and between cooling plates 840.

Figure 9A:
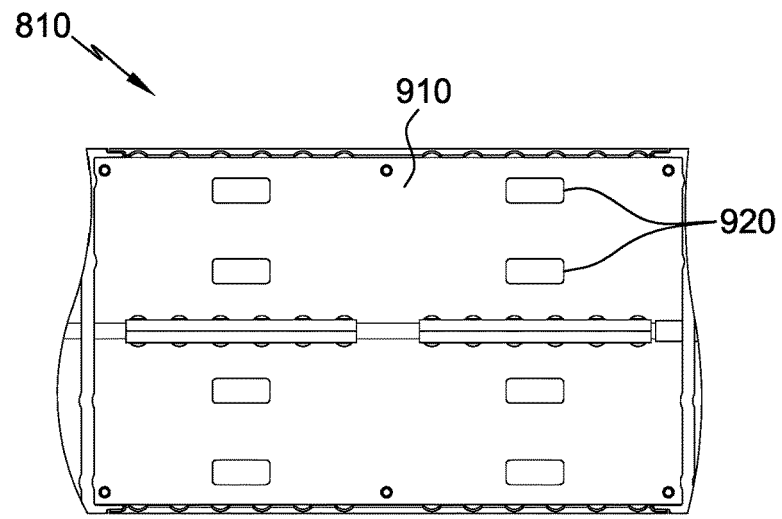
FIG. 9A is a top-down view of an example sub-assembly of the enclosure shown in FIG. 8.

FIG. 9A is a top-down view of an example sub-assembly 810 of enclosure 800 (shown in FIG. 8). In the example embodiment, sub-assembly 810 is bordered below by a circuit board 910 that includes a plurality of female connectors 920 (shown only as a rectangular space in FIG. 9A) configured to mate with male connectors of caddies (e.g., connector 784 of caddy 500, shown and described in reference to FIG. 7C). Circuit board 910 includes data and power paths to enable data and power to pass into and out from caddies.

Figure 9B:
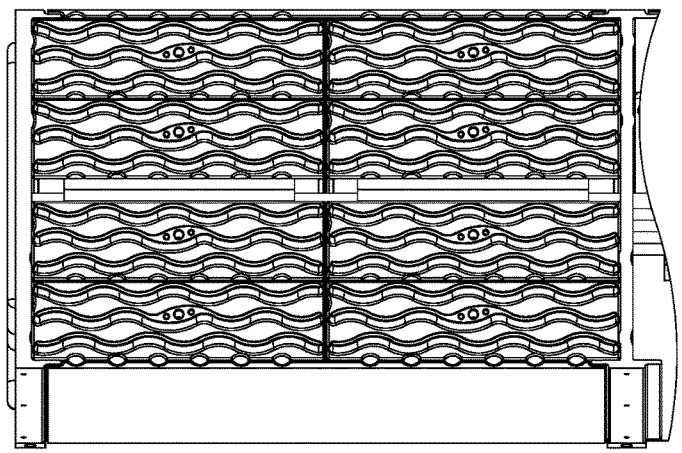
FIG. 9B is a top-down view of the example sub-assembly from FIG. 9A, shown with 8 caddies installed within sub-assembly.

FIG. 9B is a top-down view of the example sub-assembly 810 shown in FIG. 9A. In the example embodiment, sub-assembly 810 is shown with 8 caddies installed within sub-assembly 810.

Figure 10:
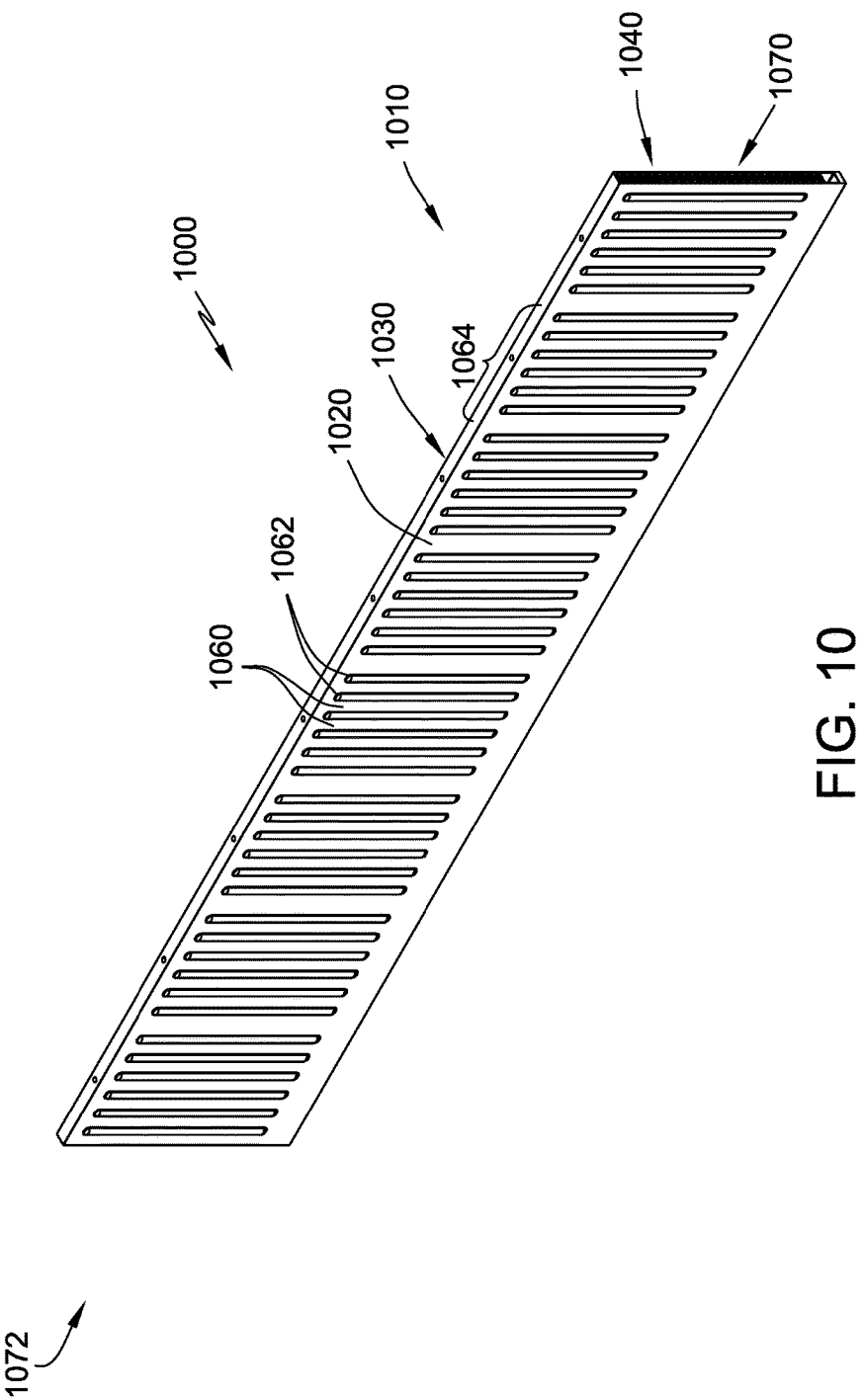

FIG. 10 is a perspective view 1000 of an alternative cooling divider 1010 that may be used with enclosure 800 (shown in FIG. 8) (e.g., in place of cooling divider 816). In the example embodiment, cooling divider 1010 includes side walls 1020 and 1030. Side walls 1020 and 1030 include a plurality of ridges 1062 separated by a plurality of plateaus 1060. In some embodiments, ridges 1062 are similar in size and shape to ridges 362 (shown in FIGS. 4A-4B), and are separated the same distances apart such that plateaus 1060 are similar to plateaus 160 (shown in FIG. 1). In other embodiments, ridges 1062 may be valleys similar to valleys 162 (shown in FIG. 1). In the example embodiment, caddy 100 includes 6 valleys. As such, cooling divider 1010 includes a plurality of groups 1064 of ridges 1062 and plateaus 1060 spaced such that a plurality of drives may be aligned down side walls 1020 and 1030, allowing the ridges 1062 and plateaus 1060 of each group 1064 to align with and match the valleys 162 and plateaus 160 of caddies (e.g., caddy 100 (shown in FIG. 1) or caddy 500 (shown in FIG. 5)).

Cooling divider 1010, in the example embodiment, also includes an interior space 1040 defined between side walls 1020 and 1030. During operation, adjacent caddies 100 transfer heat through contact between the outer surfaces of caddies 100 and side walls 1020 and 1030. An air or fluid flow is forced into an entry end 1070 and through interior space 1040 of cooling divider 1010 such that the flow removes heat from cooling divider 1010. The heated flow exits exit end 1072, thereby removing heat from caddies 100 and the computing components enclosed therein (e.g., disk drive 200).

Figure 11:
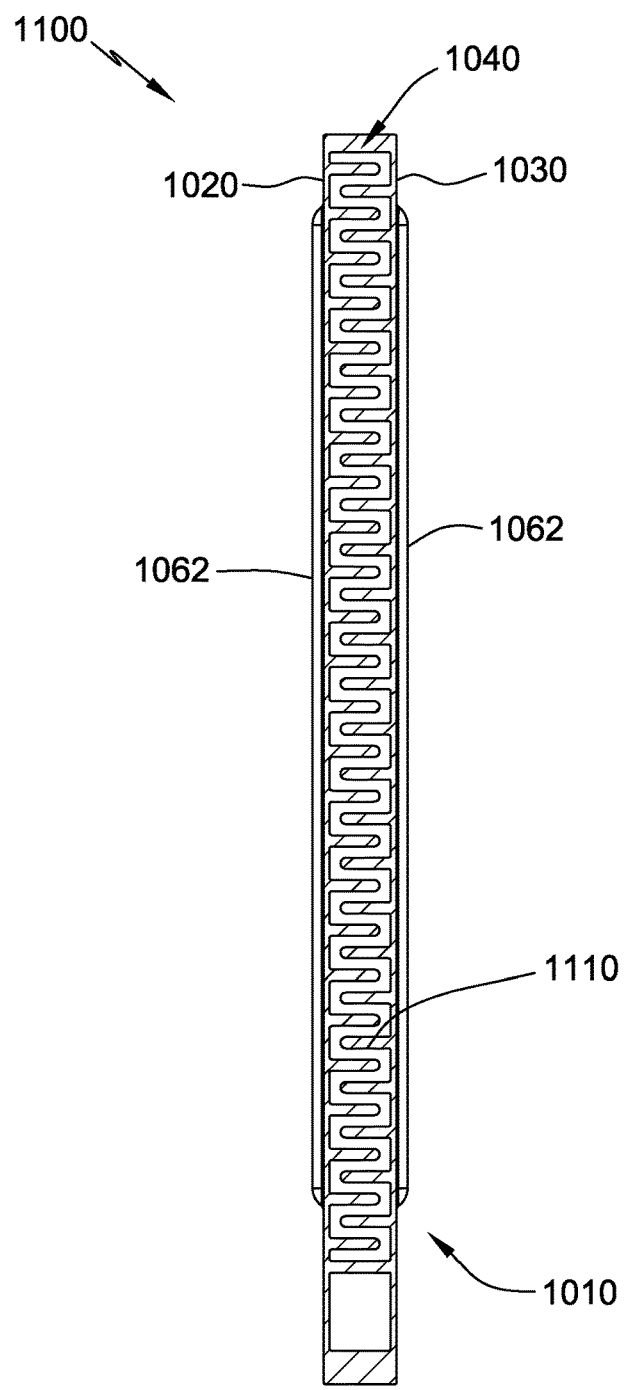

FIG. 11 is a section view 1100 of cooling divider 1010. Cooling divider 1010 includes a radiator component 1110 within interior space 540. Radiator component 1110 represents a gap or empty section of cooling divider 1010 through which an air or fluid flow is forced during operation.

The exemplary methods and systems described herein facilitate heat and airflow management in computing devices, such as storage devices. Devices are enclosed and sealed within a plurality of caddies. The caddies are installed within a device enclosure. A cool air or liquid flow is forced across the caddies and, more specifically, through a plurality of fins at the tops and bottoms of the caddies. As devices become heated during operation, heat is transferred from the devices through the caddies and into the fins. The cool fluid passing over the fins removes heat from the fins, thereby cooling the caddy and the device inside.

Exemplary embodiments of methods and systems are described and/or illustrated herein in detail. The exemplary systems and methods are not limited to the specific embodiments described herein, but rather, components of each system and/or steps of each method may be utilized independently and separately from other components and/or method steps described herein. Each component and each method step may also be used in combination with other components and/or method steps.

This written description uses examples to disclose certain embodiments of the present invention, including the best mode, and also to enable any person skilled in the art to practice those certain embodiments, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computing device caddy for housing a computing device, the caddy comprising:
   a first end wall;
   a second end wall opposite of the first end wall, wherein a cavity is defined between the first end wall and the second end wall for housing the computing device; and
   a plurality of fins coupled to an outer surface of at least one of the first end wall and the second end wall, wherein the plurality of fins are configured relative to each other to create eddies within a flow, wherein the plurality of fins includes a first plurality of fins coupled to the first end wall, the first plurality of fins including a first fin and a second fin adjacent to the first fin, wherein the first fin and the second fin define serpentine cross-sectional profiles and extend from a first side to a second side of the first end wall, wherein the first fin and the second fin define a flow channel therebetween.

2. The computing device of claim 1, wherein the flow channel includes a plurality of chambers and a plurality of channels, wherein a first chamber of the plurality of chambers defines a maximum chamber width defined between the first fin and the second fin, wherein the first chamber is coupled in flow communication with an upstream gap and a downstream gap, wherein each of the upstream gap and the downstream gap defines a minimum gap width less than the maximum chamber width.

3. The computing device caddy of claim 1, wherein the first fin includes a first surface within the flow channel, wherein the first surface defines a first angle relative to the first end wall, wherein the first angle is an acute angle.

4. The computing device caddy of claim 1 further comprising
   a first side wall extending between the first end wall and the second end wall; and
   the computing device, wherein the computing device is a memory storage device comprising a first device surface in contact with the first side wall.

5. The computing device caddy of claim 4 further comprising a thermal compound disposed between the first device surface and an interior surface of the first side wall.

6. The computing device caddy of claim 1 further comprising a first side wall extending between the first end wall and the second end wall, wherein the first side wall defines at least one groove and a plurality of plateau surfaces, wherein each groove of the at least one groove is defined between adjacent plateau surfaces of the plurality of plateau surfaces.

7. The computing device of claim 1 further comprising a first side wall extending between the first end wall and the second end wall, wherein the first side wall includes at least one ridge and a plurality of plateau surfaces, wherein each ridge of the at least one ridge is disposed between two adjacent plateau surfaces of the plurality of plateau surfaces.

8. The computing device caddy of claim 1 further comprising at least one of a data connector and a power connector disposed through a port defined in one of the first end wall and the second end wall.

9. A computing device caddy for housing a computing device, the caddy comprising:
   a first end wall;
   a second end wall opposite of the first end wall, wherein a cavity is defined between the first end wall and the second end wall for housing the computing device; and
   a plurality of fins coupled to an outer surface of at least one of the first end wall and the second end wall, wherein the plurality of fins are configured relative to each other to create eddies within a flow
   a plurality of side walls extending between the first end wall and the second end wall, wherein at least one side wall of the plurality of side walls defines a first volume recessed beneath an interior surface of the at least one side wall; and
   a flexible layer coupled to the at least one side wall of the plurality of side walls and substantially covering the first volume, wherein the flexible layer comprises a first material that is gas-permeable and not liquid-permeable.

10. The computing device of claim 9, wherein the at least one side wall includes a relief aperture defined within the first volume and through the at least one side wall.

11. A computing device caddy for housing a computing device, the caddy comprising:
    a first caddy component comprising
    a first end wall including a first plurality of fins coupled to an outer surface of the first end wall, wherein the first plurality of fins are configured relative to each other to create eddies within a flow; and
    a second caddy component comprising
    a second end wall, wherein the second end wall is opposite the first end wall, wherein the second end wall includes a second plurality of fins, wherein the second plurality of fins includes a first fin and a second fin, wherein the second caddy component further includes a port defined through the second end wall and disposed between the first fin and the second fin, wherein the second end wall further includes a port fin surrounding the port, wherein the first fin, the second fin, and the port fin define an upper flow channel and a lower flow channel around the port, and
    wherein the second caddy component is coupled to the first caddy component, thereby defining a cavity for housing the computing device.

12. The computing device caddy of claim 11, wherein the first caddy component further comprises:
    a first side wall coupled approximately perpendicularly to the first end wall;
    a first edge wall coupled approximately perpendicularly to the first side wall and the first end wall; and
    and a second edge wall opposite the first edge wall and coupled approximately perpendicularly to the first side wall and the first end wall.

13. The computing device caddy of claim 11, wherein the first component further comprises a first side wall having a first interior surface, wherein the second component further comprises a second side wall having a second interior surface, wherein the computing device defines a height, wherein the first interior surface and the second interior surface define a length therebetween approximately equal to the height of the computing device.

14. The computing device caddy of claim 11,
    wherein the first caddy component further comprises
    a first side wall coupled approximately perpendicularly to the first end wall, wherein the first end wall further includes a nubbin along a first end of the first end wall proximate the first side wall, wherein the second caddy component further comprises a second side wall coupled approximately perpendicularly to the second end wall, wherein the second side wall defines a notch at a first end of the second side wall, wherein the notch is configured to receive the nubbin when the first caddy component is coupled to the second caddy component.

15. The computing device of claim 11, wherein coupling of the first caddy component to the second caddy component substantially seals the computing device within the computing device caddy.

\* \* \* \* \*